US008724422B1

(12) United States Patent
Agness et al.

(10) Patent No.: US 8,724,422 B1
(45) Date of Patent: May 13, 2014

(54) SYSTEM AND METHOD FOR CHARGING BACK-UP CHARGE STORAGE ELEMENT FOR DATA STORAGE DEVICE USING SPINDLE PHASE SWITCHING ELEMENTS

(75) Inventors: John R. Agness, Laguna Hills, CA (US); William K. Laird, Corona, CA (US); Henry S. Ung, Tustin, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 135 days.

(21) Appl. No.: 13/407,984

(22) Filed: Feb. 29, 2012

(51) Int. Cl.
*G11C 5/14* (2006.01)

(52) U.S. Cl.
USPC .......................................... 365/229; 365/226

(58) Field of Classification Search
USPC .................................................. 365/229, 226
See application file for complete search history.

(56) References Cited

U.S. PATENT DOCUMENTS

| | | | |
|---|---|---|---|
| 4,375,663 A | 3/1983 | Arcara et al. |
| 4,516,214 A | 5/1985 | Ray |
| 5,047,988 A | 9/1991 | Mizuta |
| 5,414,861 A | 5/1995 | Horning |
| 5,438,549 A | 8/1995 | Levy |
| 5,461,518 A | 10/1995 | Saiki et al. |
| 5,495,372 A | 2/1996 | Bahlmann et al. |
| 5,504,402 A | 4/1996 | Menegoli |
| 5,596,532 A | 1/1997 | Cernea et al. |
| 5,693,570 A | 12/1997 | Cernea et al. |
| 5,781,473 A | 7/1998 | Javanifard et al. |
| 5,880,622 A | 3/1999 | Evertt et al. |
| 5,889,629 A | 3/1999 | Patton, III |
| 6,115,267 A | 9/2000 | Herbert |
| 6,189,107 B1 | 2/2001 | Kim et al. |
| 6,305,628 B1 | 10/2001 | Thompson et al. |
| 6,549,361 B1 | 4/2003 | Bennett et al. |
| 6,594,102 B1 | 7/2003 | Kanda et al. |
| 6,856,556 B1 | 2/2005 | Hajeck |
| 7,038,522 B2 | 5/2006 | Fauh et al. |
| 7,126,857 B2 | 10/2006 | Hajeck |
| 7,142,400 B1 | 11/2006 | Williams et al. |
| 7,161,757 B1 | 1/2007 | Krishnamoorthy et al. |
| 7,269,755 B2 | 9/2007 | Moshayedi et al. |
| 7,362,601 B2 | 4/2008 | Uematsu |
| 7,409,590 B2 | 8/2008 | Moshayedi et al. |
| 7,548,392 B1 | 6/2009 | Desai et al. |
| 7,623,316 B1 | 11/2009 | Rana et al. |
| 7,688,534 B1 | 3/2010 | McCornack |
| 7,733,712 B1 | 6/2010 | Walston et al. |
| 7,800,856 B1 | 9/2010 | Bennett et al. |

(Continued)

FOREIGN PATENT DOCUMENTS

WO  2010151347  12/2010

*Primary Examiner* — Huan Hoang

(57) ABSTRACT

A data storage system is disclosed including a data storage device having a controller coupled to non-volatile semiconductor memory and a power device having a common power rail and first, second, and third spindle phase switching elements, the common power rail receiving an input voltage and providing power to the data storage device and the power device. The data storage system further includes an inductor coupled between outputs of the first and second spindle phase switching elements, and a charge storage element coupled between the second spindle phase switching element output and ground. The power device further includes control circuitry that controls the first and second spindle phase switching elements to generate boost output voltage for charging the charge storage element during a boost mode, the boost output voltage enabling the controller to perform a data operation in an event of an interruption of power to the data storage system.

40 Claims, 6 Drawing Sheets

(56) References Cited

U.S. PATENT DOCUMENTS

| | | |
|---|---|---|
| 7,974,038 B2 | 7/2011 | Krishnan et al. |
| 2002/0141102 A1 | 10/2002 | Kusumoto |
| 2004/0080858 A1 | 4/2004 | Suzuki |
| 2008/0111423 A1 | 5/2008 | Baker et al. |
| 2009/0140575 A1 | 6/2009 | McGee et al. |
| 2009/0206657 A1 | 8/2009 | Vuk et al. |
| 2009/0206772 A1 | 8/2009 | Bayer et al. |
| 2009/0254772 A1 | 10/2009 | Cagno et al. |
| 2009/0289607 A1 | 11/2009 | Mentelos |
| 2010/0066431 A1 | 3/2010 | Carter |
| 2010/0072816 A1* | 3/2010 | Kenkare et al. ............... 307/24 |
| 2010/0090663 A1 | 4/2010 | Pappas et al. |
| 2010/0146333 A1 | 6/2010 | Yong et al. |
| 2010/0202240 A1 | 8/2010 | Moshayedi et al. |
| 2010/0329065 A1 | 12/2010 | Johnston et al. |
| 2010/0332858 A1 | 12/2010 | Trantham et al. |
| 2011/0066872 A1 | 3/2011 | Miller et al. |
| 2011/0080768 A1 | 4/2011 | Li et al. |
| 2011/0080782 A1 | 4/2011 | Li et al. |
| 2011/0093650 A1 | 4/2011 | Kwon et al. |
| 2011/0198931 A1 | 8/2011 | Ly |
| 2013/0148240 A1 | 6/2013 | Ferris et al. |

* cited by examiner

SYSTEM AND METHOD FOR CHARGING BACK-UP CHARGE STORAGE ELEMENT FOR DATA STORAGE DEVICE USING SPINDLE PHASE SWITCHING ELEMENTS

BACKGROUND

A data storage system may comprise a data storage device (e.g., solid state drive) comprising non-volatile semiconductor memory (NVSM) (e.g., flash memory) and may be employed as mass storage for a computer device (e.g., desktop, laptop, portable, etc.) or other suitable application. The data storage device may also comprise a controller for controlling data operations to the NVSM (i.e., reading data from or writing data to the NVSM), volatile memory (e.g., DRAM) for providing temporary storage for write data coming from the host to the NVSM and read data going to the host from the NVSM, and an I/O interface for communicating between the controller and the host.

The data storage device is typically coupled to an external power supply for providing power to components of the data storage device, such as the NVSM, the controller, the volatile memory, and the I/O interface. The data storage system may also comprise one or more capacitors that can be charged to provide back-up power to the data storage device to ensure that user data is fully protected in an event of an interruption of power to the data storage device.

DETAILED DESCRIPTION

The present disclosure is directed to data storage systems and methods using two spindle phase switching elements in a power device to generate a boost output voltage for charging a charge storage element, wherein the charge storage element provides back-up power for a data storage device in an event of an interruption of power. In an embodiment, an inductor is coupled across the two spindle phase switching elements and control circuitry in the power device controls the two spindle phase switching elements to generate the boost output voltage. In an embodiment, a boost switching regulator in the power device is used to trickle charge the charge storage element when the charge storage element has been charged to the boost output voltage. In an embodiment, a controller in the data storage device is enabled when the charge storage element has been charged to the boost output voltage. In an embodiment, the charge storage element is used to provide back-up power to the data storage device when an input voltage fails below a threshold level.

Certain embodiments of the invention will now be described. These embodiments are presented by way of example only, and are not intended to limit the scope of the invention. Indeed, the novel systems and methods described herein may be embodied in a variety of forms. Furthermore, various omissions, substitutions and changes in the form of the systems and methods described herein may be made without departing from the spirit of the invention. To illustrate some of the embodiments, reference will now be made to the figures.

Figure 1A:
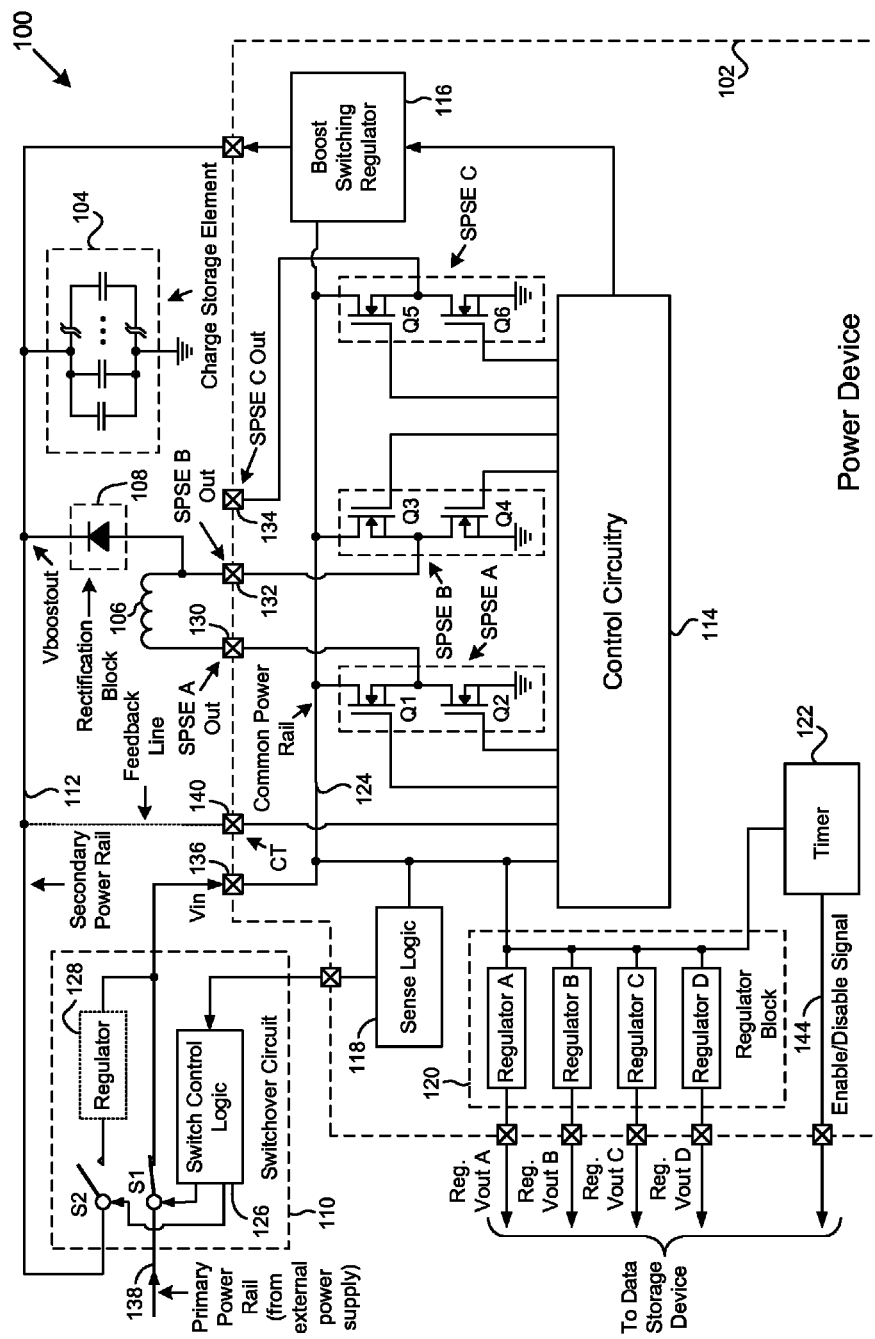
FIG. 1A shows data storage system according to an embodiment of the present invention wherein back-up power is provided for a data storage device by using two spindle phase switching elements to generate a boost output voltage to charge a charge storage element for providing back-up power, and wherein a timer is used to enable a data storage device controller when the charge storage element has been charged.

FIG. 1A shows a data storage system 100 according to an embodiment of the present invention comprising a power device 102, a charge storage element 104, an inductor 106, a rectification block 108, switchover circuit 110, and a secondary power rail 112. The data storage system 100 also comprises a data storage device 150 (shown in FIG. 1B). As shown in the embodiment in FIG. 1A, the power device 102 comprises control circuitry 114, a boost switching regulator (BSR) 116, sense logic 118, regulator block 120, timer 122, spindle phase switching elements (SPSE) A, B, and C, and a common power rail 124. In an embodiment, the control circuitry 114, the BSR 116, the sense logic 118, the regulator block 120, and spindle phase switching elements A, B, and C are situated on one integrated circuit (IC), such as an Application-Specific IC (ASIC). In the embodiment in FIG. 1A, the switchover circuit 110 comprises switch control logic 126, switches S1 and S2, and a regulator 128. In one embodiment, the regulator 128 is not utilized in the switchover circuit 110.

As shown in FIG. 1A, SPSE A comprises high side transistor Q1 coupled to low side transistor Q2, SPSE B comprises high side transistor Q3 coupled to low side transistor Q4, and SPSE C comprises high side transistor Q5 coupled to low side transistor Q6. In the embodiment of FIG. 1A, transistors Q1-Q6 each comprise an N-channel field-effect transistor (NFET). In another embodiment, each of transistors Q1-Q6 may comprise a P-channel FET (PFET) or other type of transistor. The input terminal of each of transistors Q1-Q6 is coupled to the control circuitry 114 to enable the control circuitry 114 to independently control each transistor. As shown in FIG. 1A, SPSE A, B, and C are coupled between the common power rail 124 and ground and the respective outputs of SPSE A, B, and C (provided at the junctions of the high side and low side transistors) are coupled to output terminals 130, 132, and 134 of the power device 102.

In the embodiment of FIG. 1A, a DC input side of the inductor 106 is coupled to output terminal 130 (i.e., the output of SPSE A) and the switching side of the inductor 106 is coupled to output terminal 132 (i.e., the output of SPSE B). Alternatively, the inductor 106 may be coupled between different SPSE outputs (e.g., between the outputs of SPSE A and C or the outputs of SPSE B and C). In an embodiment, the inductor 106 is coupled between first and second SPSE outputs (e.g., SPSE A and B outputs) and the third SPSE output (e.g., SPSE C output) is coupled to the first or the second SPSE output. For example, in an embodiment in which the inductor 106 is coupled between the outputs of SPSE A and SPSE B, the output of SPSE C may be coupled to the output of SPSE A or the output of SPSE B.

As shown in FIG. 1A, rectification block 108 for rectifying AC voltage is coupled between the switching side of the inductor 106 at output terminal 132 and the secondary power rail 112 and is operable to rectify an AC voltage at the switching side of the inductor 106. In the embodiment of FIG. 1A, the rectification block 108 comprises a diode. In another embodiment, the rectification block 108 may comprise a transistor or other type of device capable of rectifying AC voltage.

As shown in FIG. 1A, the charge storage element 104 is coupled between the secondary power rail 112 and ground. In the embodiment of FIG. 1A, the charge storage element 104 comprises a plurality of capacitors (e.g., a bank of capacitors) coupled together in a parallel configuration. In one embodiment, each capacitor in the charge storage element 104 is a ceramic capacitor. Alternatively, the charge storage element 104 may comprise, for example, one or more tantalum capacitors, super capacitors, or other types of non-polarized or polarized capacitors.

In an embodiment of the invention, during power up of the data storage system 100, switch S1 in the switchover circuit is initially in a closed position, thereby allowing input voltage (Vin) on the primary power rail 138 to be coupled to the common power rail 124 of the power device 102 at the input voltage terminal 136. When Vin is applied to the common power rail 124, a boost mode is triggered in the power device 102. In an embodiment of the invention, during the boost mode the control circuitry 114 is operable to control SPSE A and SPSE B to generate a boost output voltage (Vboostout) on the secondary power rail 112 for charging the charge storage element 104, wherein Vboostout is greater than Vin. For example, Vin may be 5V and Vboostout may be 12V or greater.

In an embodiment, the control circuitry 114 is operable to generate Vboostout by switching the high side FET Q1 of SPSE A on and the low side FET Q2 off, thereby causing Vin to be coupled to the DC input side of the inductor 106, switching the high side FET Q3 of SPSE B off, and switching the low side FET Q4 on and off continuously so as to generate an AC voltage at the switching side of the inductor 106. The AC voltage is rectified by the rectification block 108 (e.g., a diode) to provide Vboostout on the secondary power rail 112 for charging the charge storage element 104. In an embodiment, the control circuitry 114 is operable to switch the low side FET Q4 on and off with a controlled duty cycle. For example, the control circuitry 114 may adjust the duty cycle of the low side FET Q4 to achieve a desired level of Vboostout or to control how long to charge the charge storage element 104. In one embodiment, the control circuitry 114 controls the switching frequency of the low side FET Q4 in addition to its duty cycle.

In an embodiment, the control circuitry 114 is coupled to the secondary power rail 112 via a feedback line coupled to a center tap (CT) terminal 140 and the control circuitry 114 is operable to turn off the high side FET Q1 and the low side FET Q4 when the charge storage element 104 is fully charged to Vboostout. In one embodiment, the control circuitry 114 is not coupled to the secondary power rail 112 and the control circuitry 114 is operable to turn off the high side FET Q1 and the low side FET Q4 after Vin has been applied to the common power rail 124 for a predetermined amount of time. For example, the control circuitry 114 may turn off the high side FET Q1 and the low side FET Q4 approximately 20 milliseconds after Vin has been applied to the common power rail 124. In an embodiment, the control circuitry 114 is operable to turn off the unused spindle phase switching element (i.e., SPSE C in the embodiment in FIG. 1A).

As shown in FIG. 1A, an input of the BSR 116 is coupled to an output of the control circuitry 114 and an output of the BSR 116 is coupled to the secondary power rail 112 via output terminal 142 of the power device 102. In an embodiment, the BSR 116 is operable to provide a trickle charge to the charge storage element 104 via the secondary power rail 112 when the charge storage element 104 has been charged to Vboostout. The trickle charge provided by the BSR 116 enables the charge storage element 104 to remain charged to Vboostout when the control circuitry 114 turns off the spindle phase switching elements (SPSE A and SPSE B) that are coupled to the inductor 106. The BSR 116 uses significantly less current to trickle charge the charge storage element 104 compared to an amount of current required to charge the storage element 104 to Vboostout.

In one embodiment, the BSR 116 determines when the charge storage element 104 has been charged to Vboostout by monitoring the secondary power rail 112 via a feedback line. In one embodiment, the BSR 116 provides a trickle charge to the charge storage element 104 when the BSR 116 is enabled by the control circuitry 114. In an embodiment, the BSR 116 provides the trickle charge to the charge storage element 104 a predetermined amount of time after input voltage Vin has been applied to the common power rail 124 (i.e., a predetermined amount of time after the boost mode has been initiated). In an embodiment, the control circuitry 114 turns off the high side FET Q1 and the low side FET Q4 after the BSR 116 begins to provide the trickle charge to the charge storage element 104 via the secondary power rail 112.

In the embodiment of FIG. 1A, the secondary power rail 112 is coupled to an input terminal of switch S2, the output terminal of switch S2 is coupled to the input of a regulator 128, and the output of the regulator 128 is coupled to the input voltage terminal 136 of the power device 102. In an embodiment in which the regulator 128 is not utilized, the output terminal of switch S2 is coupled directly to the input voltage terminal 136. As shown in FIG. 1A, a primary power rail 138, which provides power from an external power supply (not shown in FIG. 1A), is coupled to the input terminal of switch S2 and the output terminal of switch S2 is coupled to the input voltage terminal 136 of the power device 102. Switches 51 and S2 may each be implemented by one or more transistors or other types of semiconductor devices.

Also shown in FIG. 1A, the outputs of the switch control logic 126 are coupled to respective control terminals of switches S1 and S2, the input of the switch control logic 126 is coupled to the output of the sense logic 118, and the input of the sense logic 118 is coupled to the common power rail 124. The switch control logic 126 is operable to control the operation of switches S1 and S2 in response to an appropriate control signal from the sense logic 118. In an embodiment, the sense logic 118 is operable to monitor Vin on the common power rail and to cause the switch control logic 126 to open or close switches S1 and S2 depending on the level of Vin. For example, if the sense logic 118 detects that Vin has fallen below a threshold level, the sense logic 118 causes the switch control logic 126 to open switch S1 and close switch S2. For example, Vin will fall below the threshold level in an event of an interruption of power to the data storage system 100. In an embodiment, switch S1 opens prior to switch S2 closing to decouple the primary power rail 138 from the common power rail 124, thereby preventing Vboostout on the secondary power rail 112 from being coupled to the primary power rail 138 and, consequently, to the external power supply.

In the embodiment of FIG. 1A, the regulator block 120 is coupled to the common power rail 124 and comprises regulators A, B, C, and D for providing respective regulated output voltages (Reg. Vout) A, B, C, and D to the data storage device 150 shown in FIG. 1B. It is noted that although the regulator block 120 comprises four regulators in the embodiment shown in FIG. 1A, the number of regulators in the regulator block 120 is dependent on the power requirements of the particular data storage device in the data storage system. Thus, in another embodiment, the regulator block 120 may comprise more or less than four regulators to provide power to a data storage device.

In an embodiment, whenever Vin falls below a threshold level, Vboostout on the secondary power rail 112 is coupled to the common power rail 124, thereby enabling the regulator block 120 to provide power to the data storage device 150 in FIG. 1B for an amount of time that depends on the storage capacity of the charge storage element 104. For example, in an embodiment in which the charge storage element 104 comprises a plurality of capacitors coupled together in a parallel configuration, the number of capacitors determines the storage capacity of the charge storage element 104 and, consequently, how long the regulator block 120 can provide power to the data storage device when the charge storage element 104 is providing power to the regulator block 120.

Figure 1B:
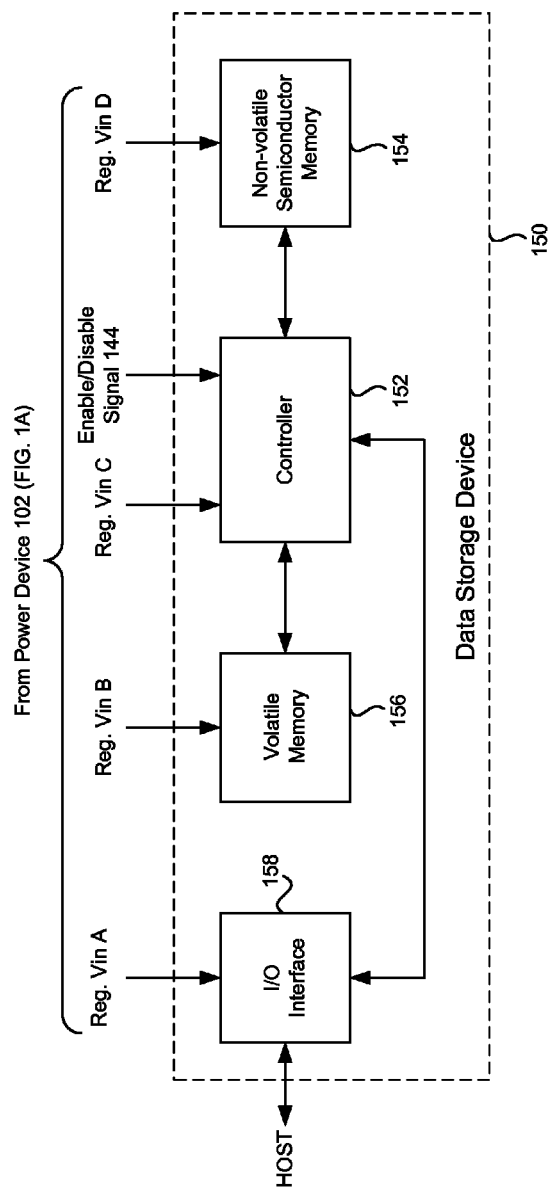
FIG. 1B shows a data storage device according to an embodiment of the present invention wherein a controller is enabled by a timer in a power device in a data storage system when a charge storage element for providing back-up power has been charged.

As shown in FIG. 1A, the timer 122 is coupled to the common power rail 124 and generates an enable/disable signal 144, which is coupled to a controller in the data storage device 150 in FIG. 1B. In an embodiment, the timer 122 is operable to enable the controller in the data storage device via the enable/disable signal 144 after input voltage Vin has been applied to the common power rail 124 for a predetermined amount of time. For example, the timer 122 may enable the controller in the data storage device after the input voltage Vin has been applied to the common power rail 124 for approximately 20 milliseconds.

FIG. 1B shows data storage device 150 according to an embodiment of the present invention comprising a controller 152, a non-volatile semiconductor memory (NVSM) 154, a volatile memory 156, and an I/O interface 158. As shown in the embodiment in FIG. 1B, the controller 152 is communicatively coupled to the NVSM 154 and is operable to control data operations to the NVSM 154 (e.g., reading data from and writing data to the NVSM 154) and is operable to read data from and write data to the volatile memory 156. The NVSM 154 may be used by the host for reading and writing data and may comprise, for example, as flash memory (e.g., NAND or NOR flash memory), Ferroelectric Memory (FeRAM), Phase Change Memory (PC-RAM or PRAM), Resistance RAM (RRAM), Single-Level Cell (SLC) memory, Multi-Level Cell (MLC) memory, or other discrete non-volatile memory chips.

In the embodiment in FIG. 1B, the controller 152 is further operable to receive the enable/disable signal 144 from the timer 122 shown in FIG. 1A and to begin controlling the aforementioned data operations when enabled by the enable/disable signal 144. In an embodiment, the controller 152 is enabled by the enable/disable signal 144 from the timer 122 (FIG. 1A) after the input voltage Vin (FIG. 1A) has been applied to the common power rail 124 (FIG. 1A) for a predetermined amount of time. In an embodiment, the controller 152 is disabled by the enable/disable signal 144 when Vin falls below a threshold voltage during a power down process.

As shown in FIG. 1B, the volatile memory 156 is communicatively coupled to the controller 152 and provides temporary storage for write data from the host and read data from the NVSM 154. For example, the volatile memory 156 may comprise dynamic random access memory (DRAM) or static random access memory (SRAM). As shown in FIG. 1B, the I/O interface 158 is communicatively coupled to the host and the controller 152 and enables communication between the host and the controller 152. In the embodiment in FIG. 1B, regulated input voltages (Reg. Vin) A, B, C, and D are received from respective regulators A, B, C, and D in the regulator block 120 (FIG. 1A) in the power device 102 (FIG. 1A).

Figure 2A:
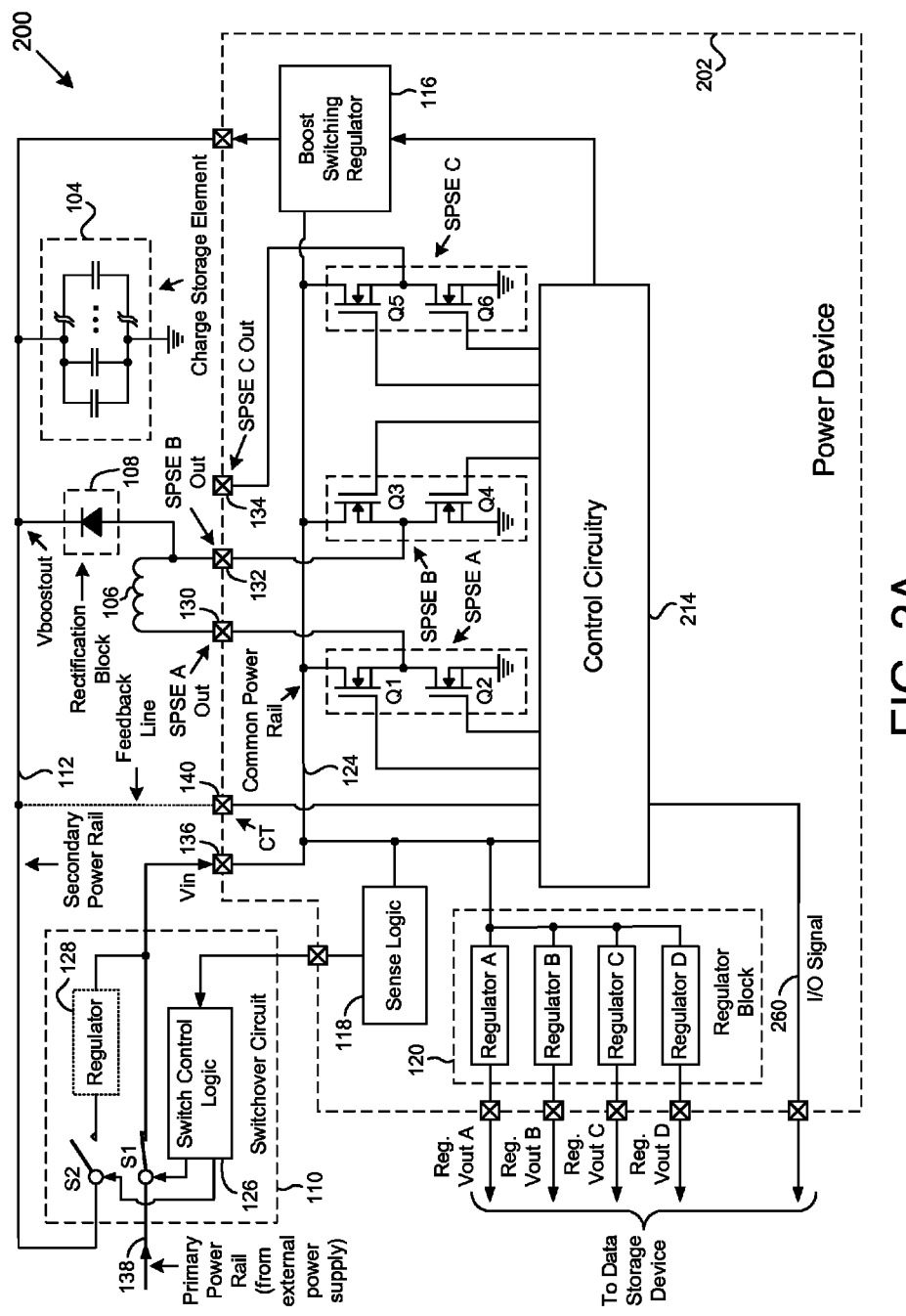
FIG. 2A shows a data storage system according to an embodiment of the present invention wherein back-up power is provided for a data storage device by using two spindle phase switching elements to generate a boost output voltage to charge a charge storage element for providing back-up power, and wherein control circuitry is used to generate an I/O signal for informing a data storage device controller when the charge storage element has been charged.
Figure 2B:
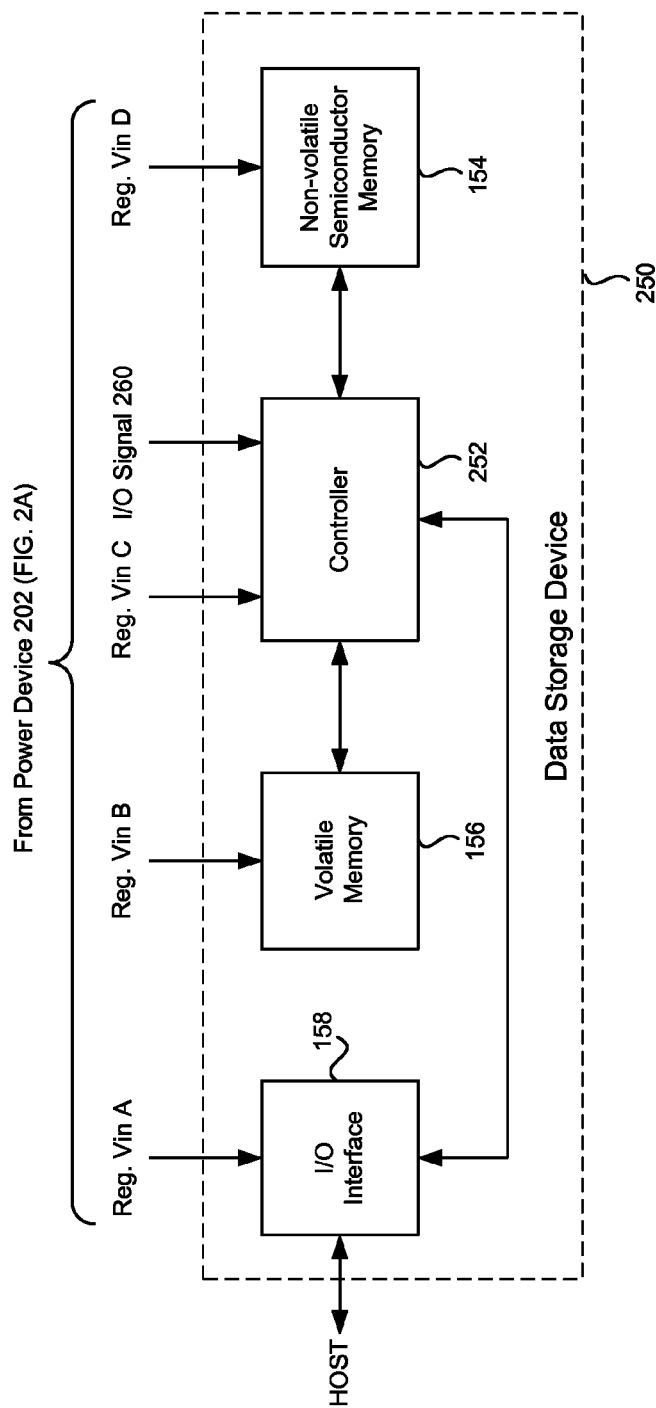
FIG. 2B shows a data storage device according to an embodiment of the present invention wherein a controller is notified via an I/O signal from control circuitry in a data storage system when a charge storage element for providing back-up power has been charged.

FIG. 2A shows a data storage system 200 according to an embodiment of the present invention. In the embodiment in FIG. 2A, the data storage system 200 comprises a power device 202 comprising control circuitry 214 and data storage device 250 (shown in FIG. 2B) comprising controller 252, wherein the control circuitry 214 is operable to send an I/O signal 260 to the controller 252 when the charge storage element 104 in the data storage system 200 has been charged to the boost output voltage Vboostout on the secondary power rail 112. In an embodiment, the I/O signal 260 notifies the controller 252 that the charge storage element 104 has been charged to Vboostout and, consequently, the charge storage element 104 is ready to provide back-up power in an event of an interruption of power to the data storage device 250 (FIG. 2B). In an embodiment, the control circuitry 214 is operable to determine when to send the I/O signal 260 to the controller 252 (FIG. 2B) by monitoring a voltage level on the secondary power rail 112 via a feedback line.

In the embodiment in FIG. 2B, the controller 252 in the data storage device 250 begins data operations after the controller 252 receives the I/O signal 260 from the control circuitry 214 (FIG. 1A). For example, the controller 252 may read data from the NVSM 154 or write data to the NVSM 154 after the I/O signal 260 has been received.

Figure 3:
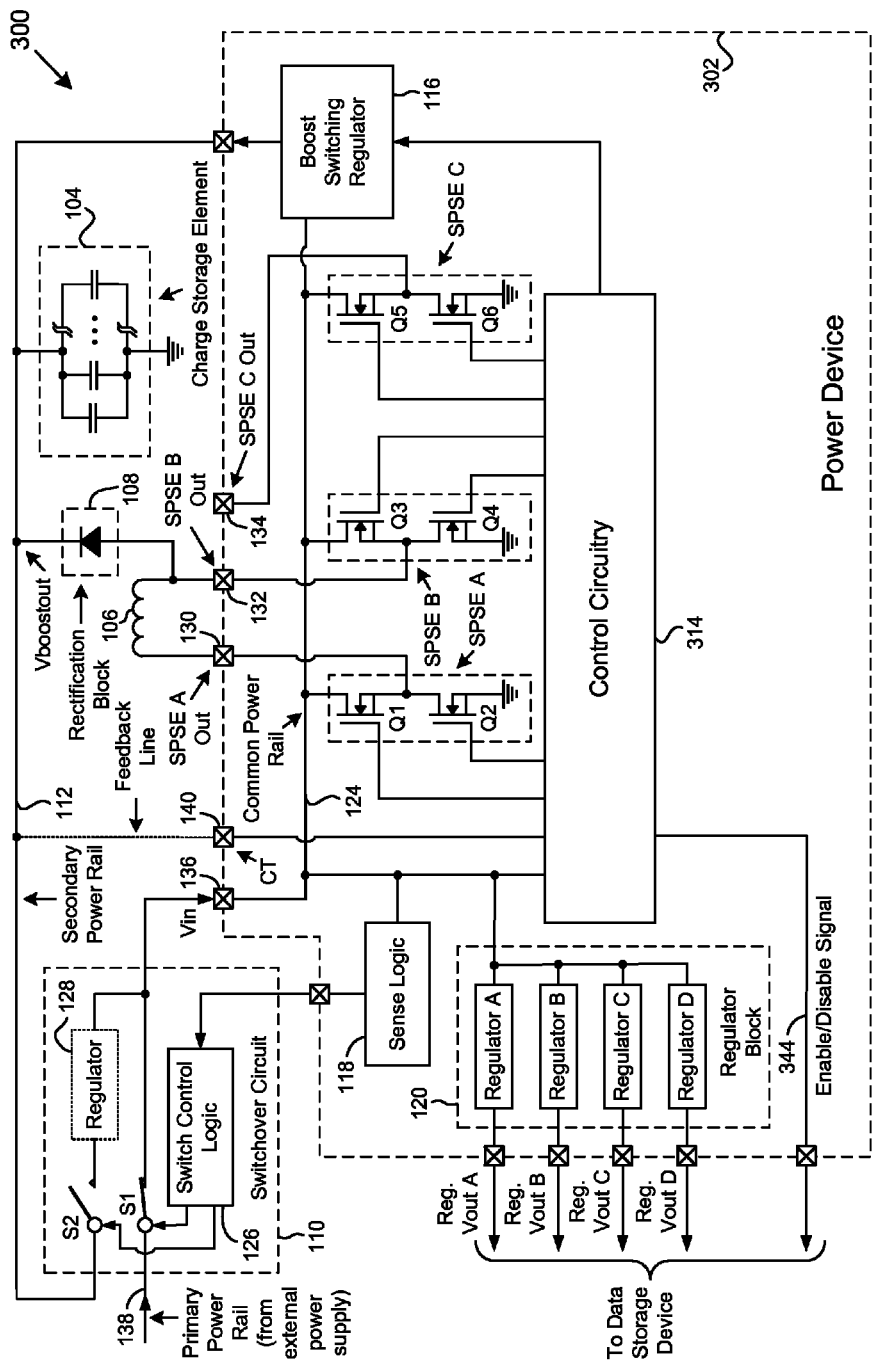
FIG. 3 shows a data storage system according to an embodiment of the present invention wherein back-up power is provided for a data storage device by using two spindle phase switching elements to generate a boost output voltage to charge a charge storage element for providing back-up power, and wherein control circuitry is used to enable a data storage device controller when the charge storage element has been charged.

FIG. 3 shows a data storage system 300 according to an embodiment of the present invention comprising power device 302, which comprises control circuitry 314. In the embodiment in FIG. 3, the control circuitry 314 is operable to enable a controller in a data storage device (such as the controller 152 in the data storage device 150 shown in FIG. 1B) by enable/disable signal 344 when the charge storage element 104 has been charged to the boost output voltage Vboostout provided at the output of the rectification block 108. In one embodiment, the control circuitry 314 is operable to enable the controller 152 (FIG. 1B) to begin data operations when the input voltage Vin is above a threshold level. In an embodiment, the controller in a data storage device is disabled by the enable/disable signal 344 when Vin falls below a threshold voltage during a power down process.

Figure 4:
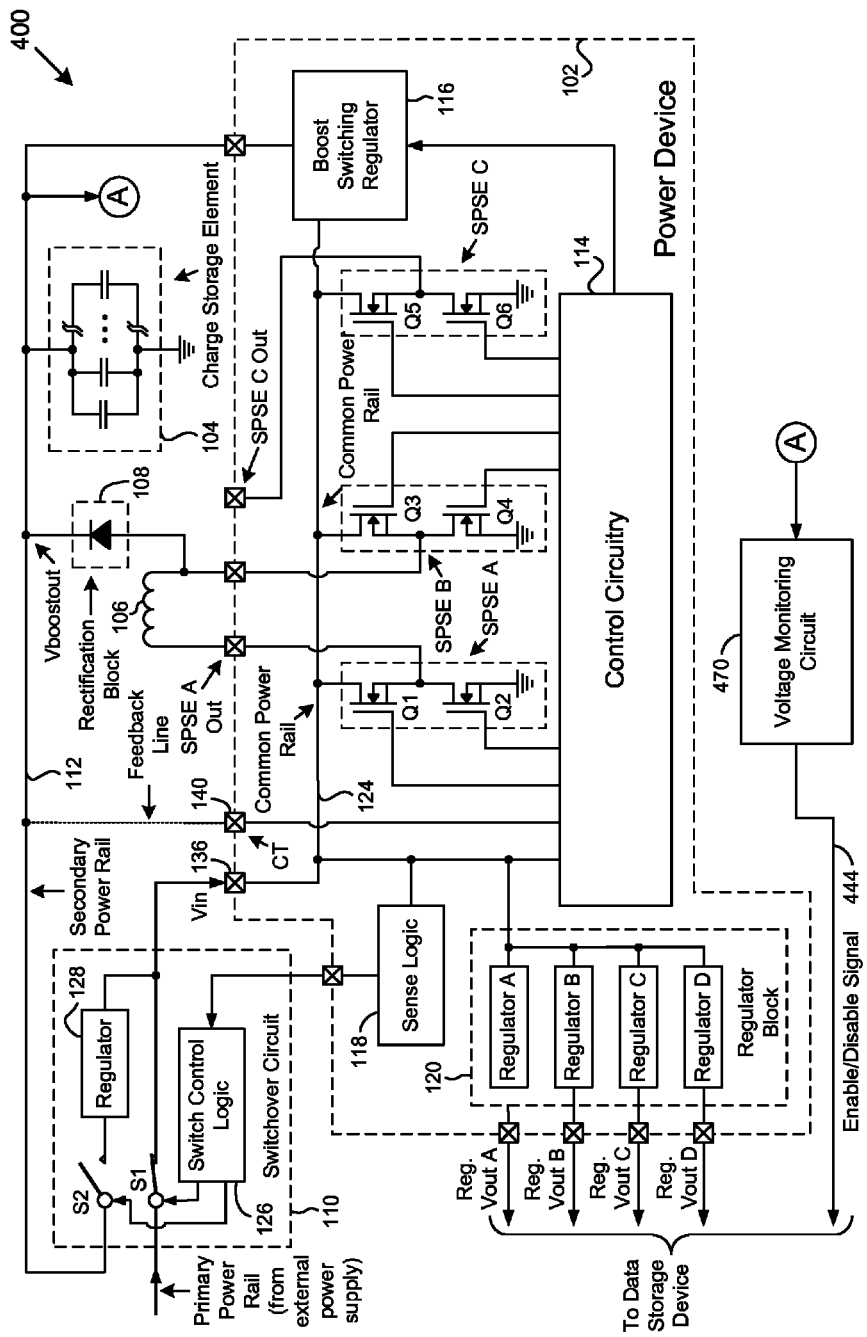
FIG. 4 shows a data storage system according to an embodiment of the present invention wherein back-up power is provided for a data storage device by using two spindle phase switching elements to generate a boost output voltage to charge a charge storage element for providing back-up power, and wherein a voltage monitoring circuit is used to enable a data storage device controller when the charge storage element has been charged.

FIG. 4 shows a data storage system 400 according to an embodiment of the present invention comprising a voltage monitoring circuit 470. In the embodiment in FIG. 4, the voltage monitoring circuit 470 is coupled to the charge storage element 104 via the secondary power rail 112 and is operable to monitor a voltage level on the charge storage element 104 and enable a controller in a data storage device (such as the controller 152 in the data storage device 150 shown in FIG. 1B) via an enable/disable signal 444 when the charge storage element 104 has been charged to Vboostout.

The features and attributes of the specific embodiments disclosed above may be combined in different ways to form additional embodiments, all of which fall within the scope of the present disclosure. Although certain embodiments have been disclosed, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A data storage system comprising:
   a data storage device comprising a controller coupled to non-volatile semiconductor memory (NVSM);
   a power device comprising a common power rail, first, second, and third spindle phase switching elements and control circuitry, the common power rail receiving an input voltage and providing power to the data storage device and the power device;
   an inductor coupled between an output of the first and an output of the second spindle phase switching element; and
   a charge storage element coupled between the output of the second spindle phase switching element and ground,
   wherein the control circuitry is operable to control the first and second spindle phase switching elements to generate a boost output voltage for charging the charge storage element during a boost mode, the boost output voltage enabling the controller to perform a data operation in an event of an interruption of power to the data storage system.

2. The data storage system as recited in claim 1, wherein the boost mode is triggered when the input voltage is applied to the common power rail.

3. The data storage system as recited in claim 1, wherein the data storage system further comprises a switchover circuit, the switchover circuit operable to couple a primary power rail providing the input voltage to the common power rail and decouple the primary power rail from the common power rail and couple a secondary power rail providing the boost output voltage to the common power rail when the input voltage falls below a threshold level.

4. The data storage system as recited in claim 3, wherein the switchover circuit comprises a first switch for coupling the primary power rail to the common power rail and a second switch for coupling the secondary power rail to the common power rail, the switchover circuit further operable to decouple the primary power rail from the common power rail by opening the first switch when the second switch couples the secondary power rail to the common power rail.

5. The data storage system as recited in claim 3, wherein the power device further comprises sense logic operable to monitor the input voltage and cause the switchover circuit to couple the secondary power rail to the common power rail when the input voltage falls below the threshold level.

6. The data storage system as recited in claim 1, wherein the power device further comprises a boost switching regulator operable to provide a trickle charge to the charge storage element.

7. The data storage system as recited in claim 6, wherein the boost switching regulator is operable to provide the trickle charge to the charge storage element after the charge storage element has been charged to the boost output voltage.

8. The data storage system as recited in claim 1, wherein the control circuitry is further operable to enable the controller when the charge storage element has been charged to the boost output voltage.

9. The data storage system as recited in claim 1, wherein the control circuitry is further operable to enable the controller when the input voltage is above a threshold level.

10. The data storage system as recited in claim 1, wherein the control circuitry is further operable to send an I/O signal to the controller to notify the controller when the charge storage element has been charged to the boost output voltage.

11. The data storage system as recited in claim 1, wherein the power device further comprises a timer operable to enable the controller after the input voltage has been applied to the common power rail for a predetermined amount of time.

12. The data storage system as recited in claim 1, further comprising a voltage monitoring circuit coupled to the charge storage element, wherein the voltage monitoring circuit is operable to enable the controller when the charge storage element has been charged to the boost output voltage.

13. The data storage system as recited in claim 1, wherein the control circuitry is coupled to the charge storage element via a feedback line.

14. The data storage system as recited in claim 1, wherein the first spindle phase switching element comprises a first low side FET coupled to a first high side FET and the second spindle phase switching element comprises a second low side FET coupled to a second high side FET.

15. The data storage system as recited in claim 14, wherein during the boost mode the control circuitry is operable to control the first and second spindle phase switching elements to generate the boost output voltage by switching the first high side FET on, switching the first low side FET off, switching the second high side FET off, and switching the second low side FET on and off continuously.

16. The data storage system as recited in claim 15, wherein the second low side FET is switched on and off with a controlled duty cycle.

17. The data storage system as recited in claim 6, wherein the first, second, and third spindle phase switching elements, the control circuitry, and the boost switching regulator are situated on one integrated circuit (IC).

18. The data storage system as recited in claim 1, wherein the charge storage element comprises a plurality of capacitors coupled together in a parallel configuration.

19. The data storage system as recited in claim 18, wherein each of the plurality of capacitors is a ceramic capacitor.

20. The data storage system as recited in claim 1, further comprising a rectification block coupled between the output of the second spindle phase switching element and the charge storage element.

21. A method of operating a data storage system, the method comprising:
   controlling first and second spindle phase switching elements of a data storage system to generate a boost output voltage for charging a charge storage element of the data storage system during a boost mode,
   wherein the data storage system comprises:
       a data storage device comprising a controller coupled to non-volatile semiconductor memory (NVSM);
       a power device comprising a common power rail, the first and second spindle phase switching elements, a third spindle phase switching element, and control circuitry, the common power rail receiving an input voltage and providing power to the data storage device and the power device;

an inductor coupled between an output of the first spindle phase switching element and an output of the second spindle phase switching element; and a charge storage element coupled between the output of the second spindle phase switching element and ground, and wherein the boost output voltage enables the controller to perform a data operation in an event of an interruption of power to the data storage system.

22. The method as recited in claim 21, further comprising triggering the boost mode when the input voltage is applied to the common power rail.

23. The method as recited in claim 21, wherein the data storage system further comprises a switchover circuit, further comprising performing the following in the switchover circuit:

coupling a primary power rail providing the input voltage to the common power rail and decoupling the primary power rail from the common power rail; and coupling a secondary power rail providing the boost output voltage to the common power rail when the input voltage falls below a threshold level.

24. The method as recited in claim 23, wherein the switchover circuit comprises a first switch for coupling the primary power rail to the common power rail and a second switch for coupling the secondary power rail to the primary power rail, further comprising performing the following in the switchover circuit:

decoupling the primary power rail from the common power rail by opening the first switch when the second switch couples the secondary power rail to the common power rail.

25. The method as recited in claim 23, wherein the power device further comprises sense logic, further comprising performing the following in the sense logic:

monitoring the input voltage and causing the switchover circuit to couple the secondary power rail to the common power rail when the input voltage falls below the threshold level.

26. The method as recited in claim 21, wherein the power device further comprises a boost switching regulator, further comprising performing the following in the boost switching regulator:

providing a trickle charge to the charge storage element.

27. The method as recited in claim 26, further comprising performing the following in the boost switching regulator:

providing the trickle charge to the charge storage element after the charge storage element has been charged to the boost output voltage.

28. The method as recited in claim 21, further comprising enabling the controller when the charge storage element has been charged to the boost output voltage.

29. The method as recited in claim 21, further comprising enabling the controller when the input voltage is above a threshold level.

30. The method as recited in claim 21, further comprising sending an I/O signal to the controller to notify the controller when the charge storage element has been charged to the boost output voltage.

31. The method as recited in claim 21, wherein the power device further comprises a timer, further comprising performing the following in the timer:

enabling the controller after the input voltage has been applied to the common power rail for a predetermined amount of time.

32. The method as recited in claim 21, wherein the data storage system further comprises a voltage monitoring circuit coupled to the charge storage element, further comprising performing the following in the voltage monitoring circuit:

enabling the controller when the charge storage element has been charged to the boost output voltage.

33. The method as recited in claim 21, wherein the control circuitry is coupled to the charge storage element via a feedback line.

34. The method as recited in claim 21, wherein the first spindle phase switching element comprises a first low side FET coupled to a first high side FET and the second spindle phase switching element comprises a second low side FET coupled to a second high side FET.

35. The method as recited in claim 34, further comprising controlling during the boost mode the first and second spindle phase switching elements to generate the boost output voltage by switching the first high side FET on, switching the first low side FET off, switching the second high side FET off, and switching the second low side FET on and off continuously.

36. The method as recited in claim 35, wherein the second low side FET is switched on and off with a controlled duty cycle.

37. The method as recited in claim 26, wherein the first, second, and third spindle phase switching elements, the control circuitry, and the boost switching regulator are situated on one integrated circuit (IC).

38. The method as recited in claim 21, wherein the charge storage element comprises a plurality of capacitors coupled together in a parallel configuration.

39. The method as recited in claim 38, wherein each of the plurality of capacitors is a ceramic capacitor.

40. The method as recited in claim 21, wherein the data storage system further comprises a rectification block coupled between the output of the second spindle phase switching element and the charge storage element.

* * * * *